Sept. 10, 1968 O. ECKERT ETAL 3,401,057
ELECTROLESS FORMATION OF ELECTRICAL RESISTANCE FILMS
Filed Feb. 17, 1964
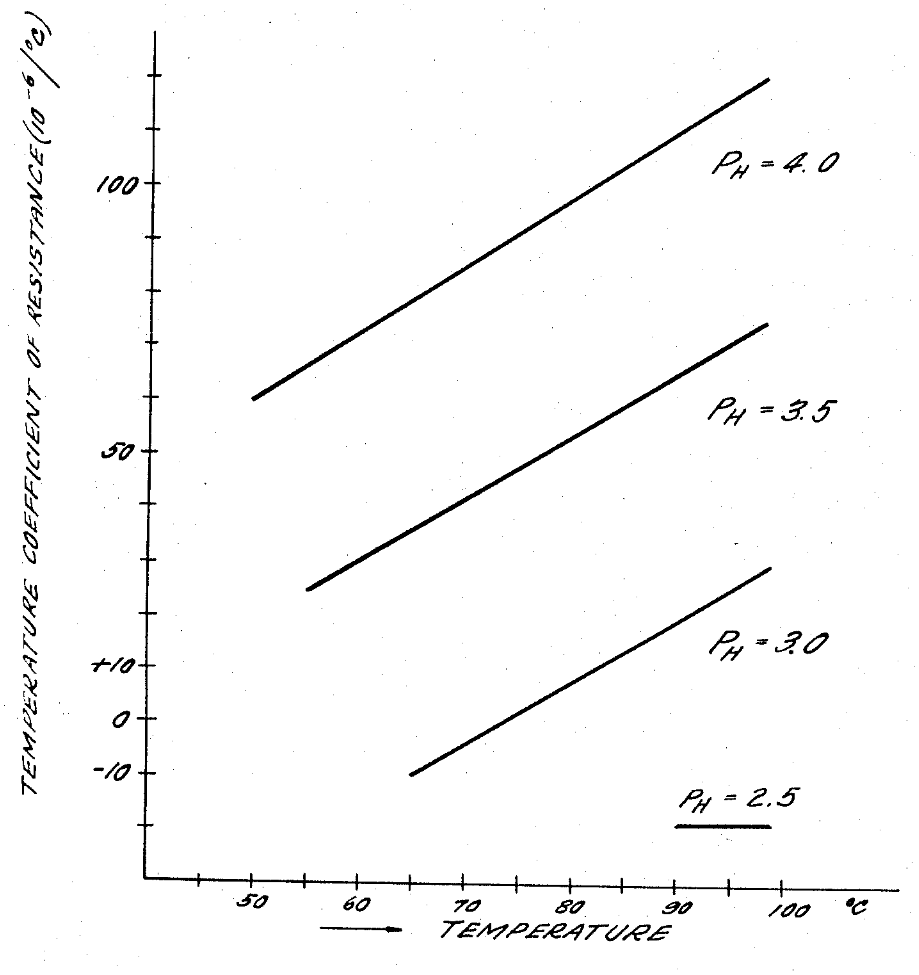
INVENTORS
OSKAR ECKERT
KLAUS STARK
BY
OSTROLENK, FABER, GERB & SOFFEN
ATTORNEYS United States Patent Office 3,401,057
Patented Sept. 10, 1968

3,401,057
ELECTROLESS FORMATION OF ELECTRICAL RESISTANCE FILMS

Oskar Eckert and Klaus Stark, Pegnitz, Germany, assignors to Steatit-Magnesia Aktiengesellschaft, Lauf, Pegnitz, Germany
Filed Feb. 17, 1964, Ser. No. 345,410
Claims priority, application Germany, Feb. 22, 1963, St 20,332
4 Claims. (Cl. 117—227)

ABSTRACT OF THE DISCLOSURE

Resistance films having relatively small temperature coefficients of resistance are deposited upon a ceramic base by means of electroless deposition. The process disclosed is particularly advantageous not only in producing film of relatively small temperature coefficients of electrical resistance, but also in providing a means whereby such film may be reproducibly prepared.

The predictable and reproducible properties of the resistive films are obtained by maintaining uniformity of temperature and pH during the deposition process.

The present invention relates to the electroless formation of resistance films, and more particularly to the production of such films having relatively small temperature coefficients of electrical resistance.

Electroless metallization by the reduction of various metal salts is a well-known phenomenon, finding diversified use throughout industry. Such techniques have been employed in the production of corrosion resistant coatings for metallic bodies, and for the preparation of covering films for electrical insulators. Such films can be utilized, for example, as conductive coatings for the electrodes of capacitors or for the barrier-free contact surfaces intermediate semiconductor elements. Films produced by electroless metallizing techniques may also be employed for the production of printed circuits or for conductive contact surfaces.

Although electroless metallizing procedures have been widely recommended in the literature, they have not, to date, been practically employed in the manufacture of electrical resistances. Known techniques for metallizing employing electroless baths containing hypophosphite ions, for example, conventionally produce films having relatively low phosphorus contents and relatively high temperature coefficients of electrical resistance, e.g., of the order of $400\times10^{-6}/°$ C., and thus cannot be readily employed for use as electrical resistance elements.

While other methods have heretofore been suggested to effect production of resistance films having relatively low temperature coefficients of electrical resistance, e.g., high vacuum volatilization, cathode sputtering and thermal decomposition under vacuum of hydrocarbons at elevated temperatures, such techniques are relatively complex and expensive to carry out.

It is accordingly among the objects of the present invention to provide a method for producing electrical resistance films, and the resulting films having relatively low temperature coefficients of electrical resistance, which films can be produced simply and economically.

The nature and objects of the invention will be more fully apparent from a consideration of the following detailed disclosure of preferred embodiments thereof, taken in connection with the accompanying drawing illustrating the variation of the thermal coefficients of resistance of resistance films produced in accordance herewith.

We have found that uniform and stable resistance films having relatively small temperature coefficients of resistance, viz., coefficients varying between about $150\times10^{-6}/°$ C. and $-150\times10^{-6}/°$ C., preferably between $$150\times10^{-6}/°\text{ C.}$$

and $-20\times10^{-6}/°$ C., may be produced by immersing insulating supports in a particular type of metallizing bath under controlled temperature and pH conditions. In accordance with the invention, electroless metallizing baths containing from about 0.03 to 0.5 mols/liter nickel ion and from about 0.05 to 0.2 mols/liter hypophosphite ion are employed, and resistance films are formed by immersing insulating substrates at temperatures of from about 50 to 98° C. within such baths, preferably for periods of from about 5 to 60 minutes, while maintaining the bath acidity within the range of from about pH 2.5–4.5.

Previously known procedures of electroless metallizing with hypophosphite ion have employed plating baths whose pH and temperature are so regulated as to produce films having the smallest possible phosphorus content. On the other hand, it is believed that the markedly reduced temperature coefficients of the resistance films produced in accordance with the present invention may result from relatively high film phosphorus content. It will, however, be understood that the present invention should not be restricted by this proposed explanation of the mechanism thereof.

We have found that the temperature coefficient of resistance of a film produced by electroless metallization is a direct function of the temperature and pH of the metallizing bath. The temperature coefficient may be decreased by reducing the temperature of the bath within the range of from about 50 to 98° C. for a constant bath pH within the range of from about 2.5 to 4.5. Similarly, the temperature coefficient may be decreased by lowering the pH of the bath while maintaining the bath temperature constant, within the specified ranges.

When the bath temperature and pH are both maintained constant, the electrical resistance of the metallized film produced therewith is dependent only on the time of metallization and the size of the film support, the resistance decreasing with an increase in metallization time.

It will also be understood that, by varying the film length, e.g., by grinding a helix into the resistance film, any desired resistance values may be provided. Accordingly, by suitably regulating the pH and temperature of a metallizing bath within the ranges described above, and by varying the duration of immersion of the insulating substrate within the metallizing bath, both the temperature coefficient of electrical resistance and the absolute resistance value of a resistance film may be determined in accordance with the user's requirements. Adequate film thicknesses have been produced, for example, by immersion in the metallizing bath and under the conditions described hereinabove for periods of from about 5 to 60 minutes.

Preferably, after formation of a resistance film upon a suitable insulating substrate, the film is stabilized by a single or multi-stage heat treatment at temperatures of from about 150° to 250° C., desirably within the range of from about 180° C. to 220° C., for a period of one or more hours, preferably from about 1 to 15 hours. By thus heating the resistance film, both its absolute resistance and its temperature coefficient of resistance is stabilized with respect to time.

The following examples illustrate preferred embodiments of the present method of electroless metallizing of resistance films:

EXAMPLES

Ceramic insulating supports in the shape of bars having lengths of 45 mm. and diameters of 7 mm. (constituted of a ceramic material commercially available under the designation "Special Steatit," DIN 40685, type 221) were thoroughly cleaned and pretreated in aqueous sensitizer solutions of $SnCl_2$ (0.1 gram/100 ml.) and $PdCl_2$ (0.1 gram/100 ml). The supports, after having been thus sensitized, were washed in distilled water and introduced into a metallizing bath having the following composition:

| | Grams/liter |
|---|---|
| Nickel chloride ($NiCl_2.6H_2O$) | 30 |
| Sodium hypophosphite ($NaH_2PO_2.H_2O$) | 10 |
| 70% technical glycolic acid | 25 |

The bath temperature was maintained constant within a tolerance of ±1° C. and the pH was adjusted by addition of caustic soda solution. Resistance films were then produced, as follows:

(1) Resistors having a temperature coefficient of resistance of $-20\times10^{-6}/°$ C. were obtained by immersion within the bath, when the latter was maintained at temperatures between 90° C. and 98° C. at a pH of 2.5;

(2) Resistors having a temperature coefficient of resistance of between $-10\times10^{-6}/°$ C. and $30\times10^{-6}/°$ C. were obtained by immersion within the bath when the latter was maintained at temperatures between 65° and 98° C. at a pH of 3.0;

(3) Resistors having a temperature coefficient of resistance of $30\times10^{-6}/°$ C. were obtained by immersion within the bath, when the latter was maintained at a temperature of 55° C. and a pH of 3.5;

(4) Resistors having a temperature coefficient of resistance of $70\times10^{-6}/°$ C. were obtained by immersion within the bath, when the latter was maintained at a temperature of 98° C. and a pH of 3.5;

(5) Resistors having a temperature coefficient of resistance of between $60\times10^{-6}/°$ C. and $120\times10^{-6}/°$ C. were obtained by immersion within the bath, when the latter was maintained at temperatures between 50° and 98° C., respectively, with the bath at a pH of 4.0.

When ceramic supports having the dimensions indicated above were metallized for periods of 10, 30 and 60 minutes, respectively, in the above bath maintained at a temperature of 94° C. and a pH of 2.5, resistors were obtained of 70, 15 and 8 ohm resistances, respectively. Each of these resistors possessed temperature coefficients of resistance of $-20\times10^{-6}/°$ C.

When ceramic supports having the dimensions indicated above were metallized for periods of 5, 10 and 30 minutes, respectively, in the above bath maintained at a temperature of 93° C. and a pH of 3.5, resistors were obtained of 13, 6 and 3 ohm resistances, respectively. Each of these resistors possessed temperature coefficients of resistance of $30\times10^{-6}/°$ C.

The resistors thus produced were thoroughly washed in water and dried. After heating the finished resistors for a period of some hours in 200° C., it was found that the resistance characteristics thereof were stabilized against change with respect to time.

The present invention thus provides a relatively simple and yet effective method for producing electrical resistance films having relatively low coefficients of resistance. Since various changes can be made in the embodiments described hereinabove without departing from the scope of the present invention, it is intended that the preceding description is illustrative and shall not be interpreted in a limiting sense.

What is claimed is:

1. A method for producing an electrical resistance film having a temperature coefficient of resistance of between $150\times10^{-6}/°$ C. and $-150\times10^{-6}/°$ C., which comprises immersing an electrically insulating support from 5–60 minutes in an electroless metallizing bath containing from 0.03 to 0.5 mols/liter nickel ion and from 0.05 to 0.2 mols/liter hypophosphite ion, said bath being maintained at temperatures of from 50 to 98° C. and having a pH of from 2.5 to 4.5 wherein the parameters of temperature and pH are maintained at a constant and predetermined level throughout the immersion step.

2. The method as defined in claim 1, including the further step of stabilizing said resistance film by heating the same at temperatures of from 150 to 250° C. for a period of from 1 to 15 hours.

3. A method for producing an electrical resistance film having a temperature coefficient of resistance of between $150\times10^{-6}/°$ C. and $-150\times10^{-6}/°$ C., which comprises immersing a ceramic electrically insulating support from 5 to 60 minutes in an electroless aqueous metallizing bath containing 30 grams/liter nickel chloride, 10 grams/liter sodium hypophosphite and 25 grams/liter of 70% technical glycolic acid, said bath being maintained at temperatures of from 50 to 98° C. and having a pH between 2.5 and 4.5 wherein the parameters of temperature and pH are maintained at a constant and predetermined level throughout the immersion step.

4. A method as defined in claim 3, including maintaining said ceramic support within the metallizing bath for a period of from 5 to 60 minutes, removing the metallized support from the bath, and heat treating the same at temperatures of from 150 to 250° C. for a period of from 1 to 15 hours to stabilize the resistance film formed thereon.

References Cited

UNITED STATES PATENTS

| | | | |
|---|---|---|---|
| 2,532,283 | 12/1950 | Brenner et al. | 117—130 X |
| 2,791,516 | 5/1957 | Chambers et al. | 117—130 X |
| 2,836,510 | 5/1958 | Bolin | 117—130 X |
| 2,955,944 | 10/1960 | Spaulding | 117—130 |
| 3,172,074 | 3/1965 | Drewes et al. | 117—227 X |

OTHER REFERENCES

Brenner et al., R. P., 1835, vol. 39, November 1947, U.S. Dept. of Commerce-National Bureau of Standards (J. of Research of NBS.).

WILLIAM L. JARVIS, *Primary Examiner.*